April 29, 1969 R. W. DREYER 3,440,716

MINIATURIZED ELECTRICAL CIRCUITS

Filed Jan. 25, 1966 Sheet 1 of 2

INVENTOR.
ROY W. DREYER,
BY J. W. Haskell
ATTORNEY.

INVENTOR.
ROY W. DREYER,
BY J. K. Haskell
ATTORNEY.

3,440,716
MINIATURIZED ELECTRICAL CIRCUITS
Roy W. Dreyer, Orange, Calif., assignor to Hughes Aircraft Company, Culver City, Calif., a corporation of Delaware
Filed Jan. 25, 1966, Ser. No. 522,875
Int. Cl. B01j *17/00;* H01l *1/16*
U.S. Cl. 29—577 5 Claims

ABSTRACT OF THE DISCLOSURE

A method for constructing miniaturized electrical circuits including (1) piercing a resilient substratum having a predetermined electrical conducting pattern bonded thereon to produce a slot and a pair of tabs and (2) inserting an electronic component into the slot and between the tabs in contact with the conductive pattern. A bonding agent securely affixes the electronic component to the conductive part of the tabs.

This invention relates to miniaturized electrical circuits and to a method of constructing miniaturized electrical circuits. More particularly, this invention relates to miniaturized electrical circuits having a high packaging density of electrical components.

In the past, great difficulty has been experienced in constructing miniaturized electrical circuits wherein the area occupied by the interconnecting materials is less than that area occupied by the electrical components in the circuits. This difficulty can usually be traced to the problems of mounting the electrical components on the interconnecting material, aligning the electrical components on the interconnecting material, and electrically connecting the electrical components to the interconnecting material and to the external connections.

Further difficulties were also encountered in retaining the electrical components in the interconnecting material when it was desired to affix a potting compound between the surfaces of the electrical component and the interconnecting material to ensure the proper mounting of the electrical components. Furthermore, such an arrangement required the subsequent removal of excessive potting compound and additional inspection to ensure that any excessive potting compound would not interfere with any electrical connection. Additional costs were incurred because of the type of interconnecting material utilized and the necessary expensive drilling of that material.

It is, therefore, an object of this invention to provide an improved method of constructing miniaturized electrical circuits.

It is a further object of this invention to provide a relatively inexpensive interconnecting material which may be economically pierced to facilitate mass production of miniaturized electrical circuits.

It is still a further object of this invention to provide an improved miniaturized electrical circuit.

It is another object of this invention to provide a higher packaging density of components in miniaturized electrical circuits.

It is still another object of this invention to provide an improved method of retaining the components in the interconnecting material without having to affix a potting compound between the surfaces of the component and the interconnecting material thus obviating the subsequent removal of the excessive potting compound to ensure proper electrical connection.

Briefly, in accordance with the objects set forth above, the present invention provides a simple, inexpensive method of constructing electrical circuits. The method includes the piercing of a resilient substratum having a predetermined electrical conducting pattern bonded thereon to obtain at least one opening, and the inserting of an electronic component into each opening in order to construct an electrical circuit.

An apparatus in accordance with the present invention comprises a circuit base sheet having a resilient substratum and an electrical conducting pattern bonded thereon, and at least one electronic component connected to the electrical conducting pattern by extended tabs of the circuit base sheet.

Additional objects, advantages, and characteristic features of the present invention will become readily apparent from the following detailed description of preferred embodiments of the invention when considered in conjunction with the accompanying drawings in which.

Figure 1:
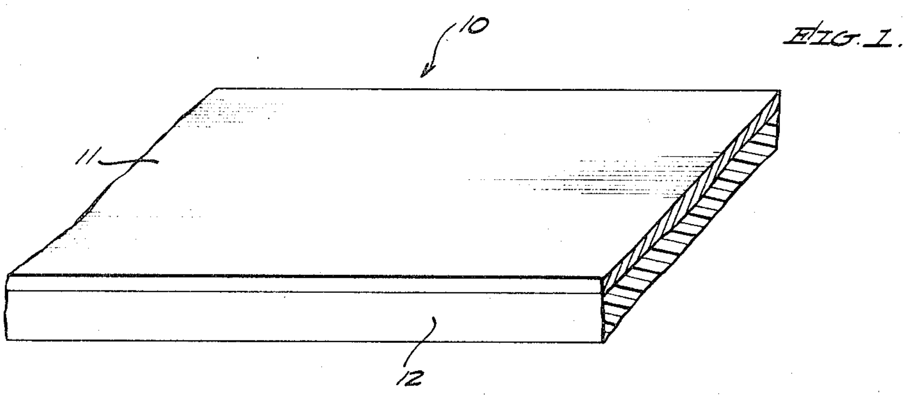
FIG. 1 is a perspective view of a circuit base sheet.

In accordance with the present invention, the figures illustrate the steps of a method of manufacturing miniaturized electrical circuits. As shown in FIG. 1, a sheet of suitable electrically conductive material 11 and a sheet of insulative material 12, which serves as the resilient substratum, are bonded to form a circuit base sheet 10. The circuit base sheet 10 illustrated would be but one part of a large sheet of similar material whereon numerous electrical circuits may be constructed. The two sheets 11 and 12 may be bonded by conventional means, such as, a thermo-pressure application or a suitable adhesive material. Suitable sheets have been bonded as described wherein the electrically conductive material 11 and the insulative material 12 have a thickness of approximately 1.2 mils and 3 mils, respectively.

A number of materials may be utilized as the electrically conductive material 11 depending upon the electrical conductivity requirements of the electrical circuit to be constructed. In most cases a material such as copper would be adequate. The insulative material 12 may be made of a resin or plastic material having resilient characteristics and also having the capability of retaining its molecular property when exposed to a soldering temperature of 200° C. Numerous materials may be commercially purchased which would suffice to be utilized as the insulative material 12, the resilient substratum, in the process of the present invention, for example, a polyester material commercially known as "Mylar," trademark of E. I. du Pont de Nemours and Company.

Figure 2:
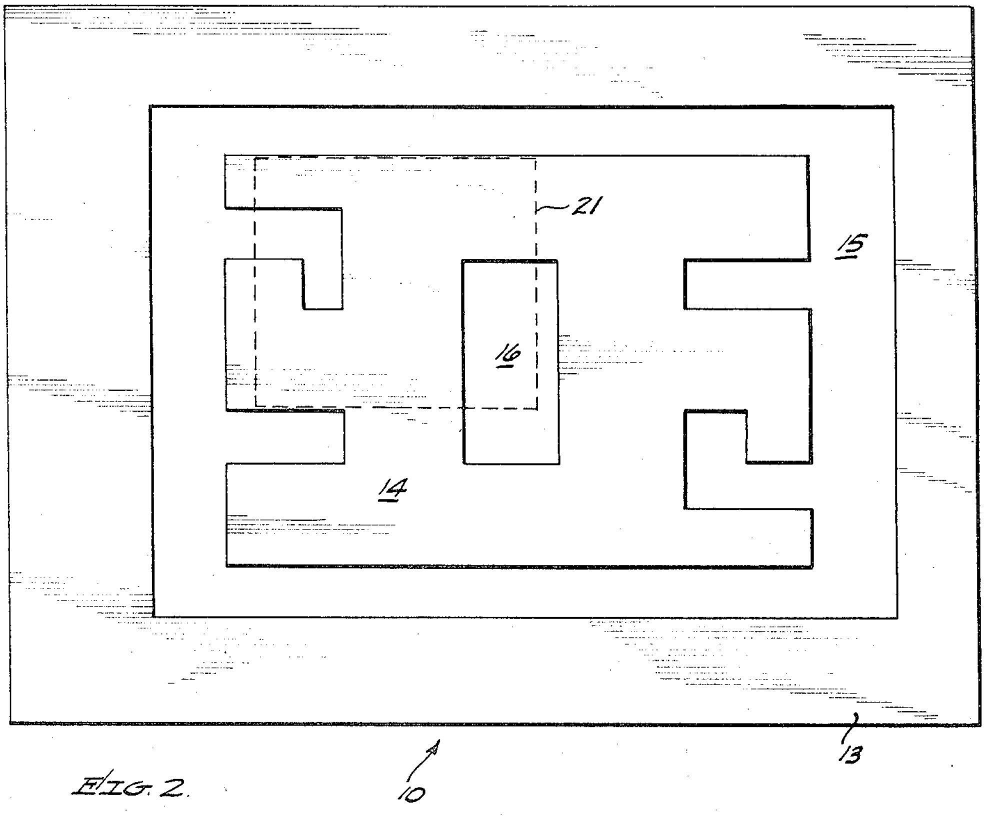
FIG. 2 is a plan view of the circuit base sheet of FIG. 1 having an electrical conducting pattern thereon.

In FIG. 2 a plan view of the circuit base sheet 10 of FIG. 1 is shown subsequent to having undergone a process to form a desired electrical conducting pattern 14 thereon. A suitable process would be the well known process of etching, wherein the electrically conductive material 11 of FIG. 1 is coated with a photo-resist material, and this photo-resist material is then sensitized by exposure to a light image of the electrical conducting pattern to be formed. The non-sensitized portions of the electrically conductive material 11 are then etched away, leaving the desired electrical conducting pattern 14, and then the photo-resist is washed away. The pattern 14 of FIG. 2 may be the basic form for a full wave bridge rectifier circuit, for example. The area 13 is the excessive electrically conductive material that is not necessary to the construction of the desired electrical circuit. The areas 15 and 16 are the exposed portions of the insulative material 12 of FIG. 1 whereon the electrically conductive material 11 has been delineated by the aforementioned etching process. For economic reasons, a number of circuits would be mass produced at one time, thus the excessive material 13 would connect a series of similarly constructed full wave bridge rectifier circuits, not shown.

Figure 3:
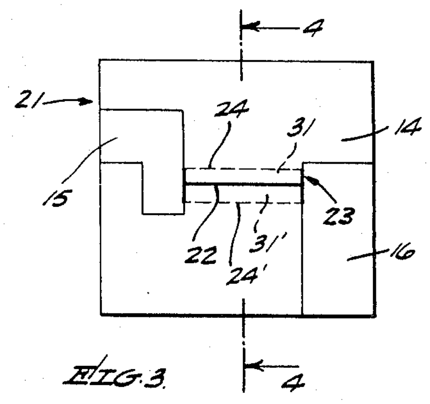
FIG. 3 is a view of a portion of the circuit base sheet of FIG. 2 defined by the dashed lines thereon.

Referring now to FIG. 3 a view of a portion of the circuit base sheet 10 of FIG. 2 is shown. This portion 21 of the circuit base sheet 10 includes part of the electrically conductive material 11 and the insulative material 12 comprising the pattern 14 and the exposed insulative areas 15 and 16. Connected leads comprising the portion 21 of the circuit base sheet 10 of FIG. 2 is pierced along a line 22 to form an H-shaped configuration 23 comprising separate leads to provide for insertion, for example, of a diode. Components other than diodes, however, can be inserted in sheet 10 such as resistors, capacitors and transistors, depending upon the circuit to be constructed. For convenience and illustrative purposes, the invention will be described with respect to the insertion of a diode in the form of a pellet, for example, having exposed electrically conductive ends or caps for use in a full wave bridge rectifier circuit. The width of the H-shaped configuration 23 along line 22 is dependent upon the size of the pellet to be inserted in the opening. The circuit base sheet 10 may be pierced by conventional cutting means, for example, a punch press. For the purpose of mass production, as stated earlier, additional openings may be made in the other circuit base sheets at the same time. The circuit base sheet 10 is pierced along line 22 of the H-shaped configuration in order to form tabs 31 and 31' in the areas enclosed by the lines represented by the H-shaped configuration and the dotted lines 24 and 24' respectively. The tabs 31 and 31' are resilient to the extent that they will exert a spring pressure on an electronic component inserted between them, but are not necessarily resilient to the degree that they will return to their original state.

Figure 4:
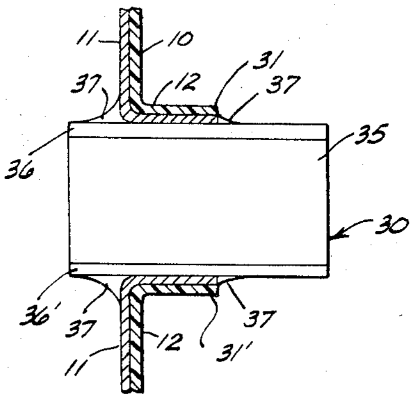
FIG. 4 is an enlarged partial sectional view of the circuit base sheet of FIG. 3 taken on line 4—4 thereof with a diode pellet inserted into an opening provided in accordance with the invention.

Referring now to FIG. 4 a sectional view of FIG. 3 is shown wherein a pellet diode 30 is then inserted between the tabs 31 and 31' of the circuit base sheet 10. The tabs 31 and 31' are at right angles to the circuit base sheet 10 after insertion of the diode pellet 30. Because the circuit base sheet 10 is made of a resilient material, the tabs 31 exert a spring pressure on the sides of the pellet diode 30 so that the diode pellet 30 will be firmly retained within the opening made in the circuit base sheet 10 and so that further processing may be accomplished if desired. Since the diode pellet 30 is retained in the opening by the pressure exerted by the tabs 31, there is no need for applying a potting compound between the surfaces of the pellet diode 30 and the tabs 31, nor is the tolerance of the fitting as critical. Thus, the form of retention in the present invention is relatively inexpensive. However, an electrically conductive bonding material 37 may be affixed if desired.

The pellet diode 30 comprises, for example, an insulating cylindrical sleeve having opposed round end sections of silver or silver clad nickel 36, or a suitable material, and an insulative material 35 which houses the associated materials of the pellet diode sandwiched between the two end sections. Typically, the thickness of such a pellet diode 30 may be approximately 30 mils and the thickness of the insulative material 35 may be approximately 25 mils. The insulative material 35 may be made of glass, for example. As illustrated in FIG. 4, it is possible to bond the diode pellet 30 to the tabs 31 of the circuit base sheet 10. The bonding material 37 may be of any electrically conductive bonding material, for example, solder. The bonding material 37 is applied to the four points of contact between the pellet diode 30 and the base sheet 10 as illustrated in FIG. 4. For the purpose of mass production, a preferred step would be dip soldering. However, it should be pointed out that depending upon the utilization of the circuit, bonding or soldering the electronic components to the electrical circuit pattern may be desirable but not always necessary.

Figure 5:
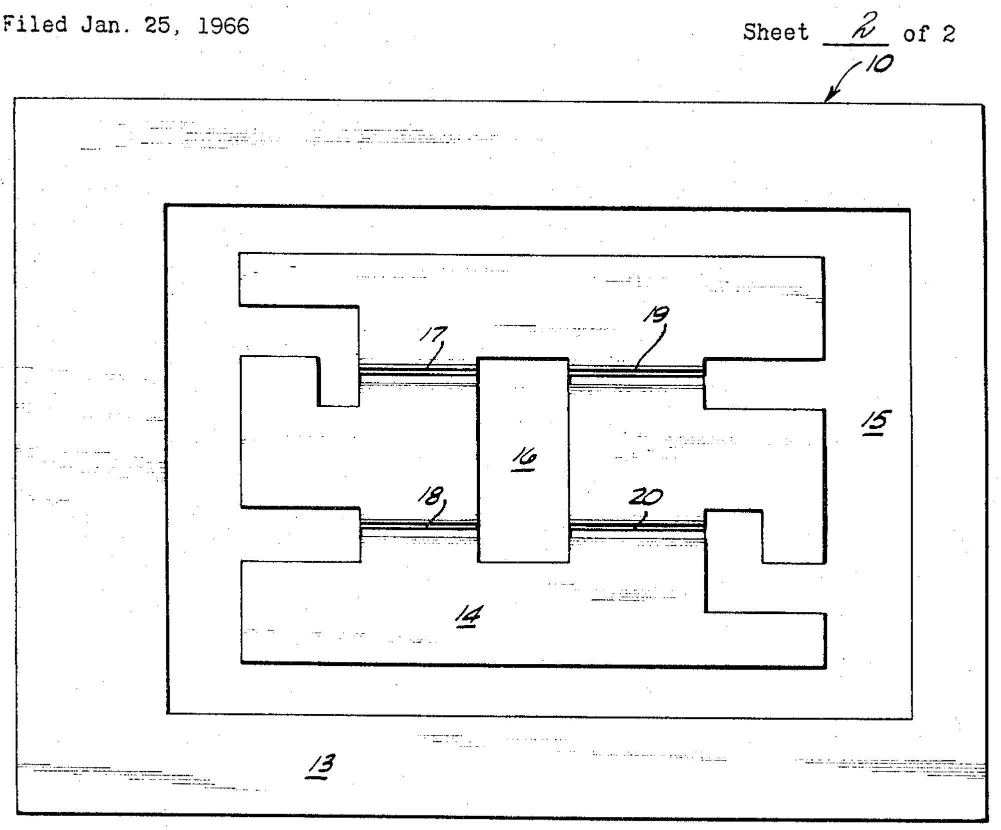
FIG. 5 is a plan view of the circuit base sheet similar to the view of FIG. 2 showing tabs for insertion of electronic pellets.

In FIG. 5, a full wave bridge rectifier circuit pattern is shown wherein the aforementioned step of piercing the circuit base sheet has been undertaken. The openings 17, 18, 19 and 20 have been made in order that four components such as pellet diodes may be inserted in the circuit base sheet 10 to complete a full wave bridge rectifier circuit.

After the four pellet diodes of the full wave bridge rectifier circuit have been mounted in the circuit base sheet 10, suitable leads, not shown, may be affixed to the electrical conducting pattern 14 in order to provide external electrical connections. Then the full wave bridge rectifier circuit may be coated with an insulative material to protect the exposed electrical conducting surfaces, if such protection is desired. This coating is preferably done by spray coating the full wave bridge rectifier circuit with a transparent insulative material, not shown, or by a dipping process.

Thus, although the present invention has been shown and described with reference to particular embodiments, nevertheless, various changes and modifications obvious to a person skilled in the art to which the invention pertains are deemed to lie within the spirit, scope and contemplation of the invention as set forth in the appended claims.

I claim:

1. A method for constructing an electrical circuit on a resilient substratum having a predetermined conducting pattern bonded thereon, said conducting pattern including connected leads, which comprises the steps of:

piercing said substratum and said conducting pattern at said connected leads into at least two separate extended tabs; and inserting an electronic component having at least two connection points between said respective tabs so that the electronic component is firmly retained by and between said respective extended tabs and so that each of said tabs has an electrical connection with each of said connection points.

2. A method for constructing an electrical circuit on a circuit base sheet having a resilient substratum and a predetermined conducting pattern bonded thereon, said conducting pattern including at least one pair of connected leads, which comprises the steps of:

piercing said resilient substratum and said predetermined conducting pattern at said pair of connected leads to provide at least one opening and at least two separate extended tabs of said base, at least two of said tabs located in proximity to each respective opening to form a pair of separate leads; and inserting an electronic component having at least two connection terminals into each said opening and between said respective tabs so that the electronic component is firmly retained within each said opening by said respective extended tabs and so that each of said tabs is in electrical contact with each of said terminals.

3. A method as recited in claim 1 wherein said piercing and inserting steps are repeated for a plurality of electronic components so that a plurality of electrical conducting paths are formed by said electronic components and said predetermined electrical conducting pattern.

4. A method for constructing an electrical circuit, which comprises the steps of:

bonding an electrically conductive material to a resilient insulative substratum to form a base;

forming a predetermined electrical conducting pattern of said electrically conductive material;

piercing said base to provide a plurality of openings formed thereon by a plurality of pierced extended tabs of said base;

inserting an electronic component in each said opening so that each said electronic component is retained in respective openings by respective extended tabs of said base;

applying an electrically conductive bonding material to the exposed adjacent electrically conductive surfaces of said electrically conductive material and said electronic component;

connecting external leads to the electrical circuit constructed; and coating said electrical circuit with an insulative material.

5. A method for constructing a full wave bridge rectifier circuit, which comprises the steps of:

bonding an electrically conductive material to the resilient insulative substratum to form a base;

forming a predetermined electrical conducting pattern of said electrically conductive material;

piercing said base to provide four openings formed thereon by a plurality of pierced extended tabs of said base;

inserting a diode in each said opening so that each said diode is retained in said respective openings by respective extended tabs of said base;

applying an electrically conductive bonding material to the exposed adjacent electrically conductive surfaces of said electrically conductive material and said diodes;

connecting external leads to the full wave bridge rectifier circuit constructed; and coating said full wave bridge rectifier circuit with an insulative material.

References Cited

UNITED STATES PATENTS

| | | | |
|---|---|---|---|
| 2,433,384 | 12/1947 | McLarn | 317—101 X |
| 2,720,578 | 10/1955 | Caffiaux | 29—626 X |
| 2,777,039 | 1/1957 | Thias. | |
| 3,134,930 | 5/1964 | Wright. | |

JOHN F. CAMPBELL, *Primary Examiner.*

R. B. LAZARUS, *Assistant Examiner.*

U.S. Cl. X.R.

29—589, 590, 591, 626, 627; 317—101